United States Patent [19]

Miura et al.

[11] Patent Number: 4,564,814

[45] Date of Patent: Jan. 14, 1986

[54] FULL-WAVE RECTIFIER USING AN OPERATIONAL AMPLIFIER

[75] Inventors: Masami Miura; Takeshi Kuwajima, both of Tokyo, Japan

[73] Assignee: Nippon Electric Co., Ltd., Tokyo, Japan

[21] Appl. No.: 435,173

[22] Filed: Oct. 19, 1982

[30] Foreign Application Priority Data

Oct. 20, 1981 [JP] Japan ................................ 56-167635

[51] Int. Cl.4 ................................................ H03K 5/00

[52] U.S. Cl. ....................................... 328/26; 307/261; 307/262; 307/494; 363/127

[58] Field of Search ............... 307/261, 494, 260, 262; 328/26; 363/127

[56] References Cited

U.S. PATENT DOCUMENTS 4,333,141 6/1982 Nagano .............................. 363/127

*Primary Examiner*—Stanley D. Miller

*Assistant Examiner*—Richard Roseen

*Attorney, Agent, or Firm*—Sughrue, Mion, Zinn, Macpeak, and Seas

[57] ABSTRACT

A full-wave rectifier having a limited number of circuit elements comprises an amplifier, such as an operational amplifier, having an inverting input held at a reference potential, a non-inverting input receiving an input signal through a first resistor and an output, a transistor having its base connected to the output of the amplifier and its collector connected to the non-inverting input of the amplifier through a second resistor and optionally an output circuit for producing an output signal from the connection point between the collector of the transistor and the second resistor.

16 Claims, 8 Drawing Figures

FIG. 1
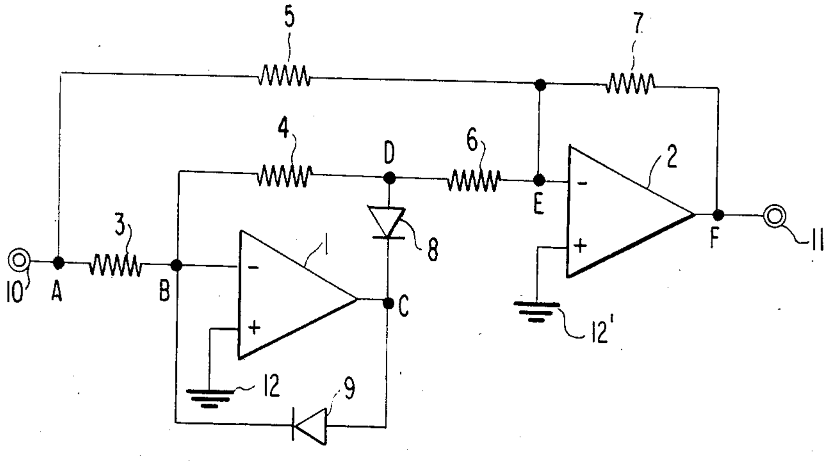
FIG. 2(a)
PRIOR ART
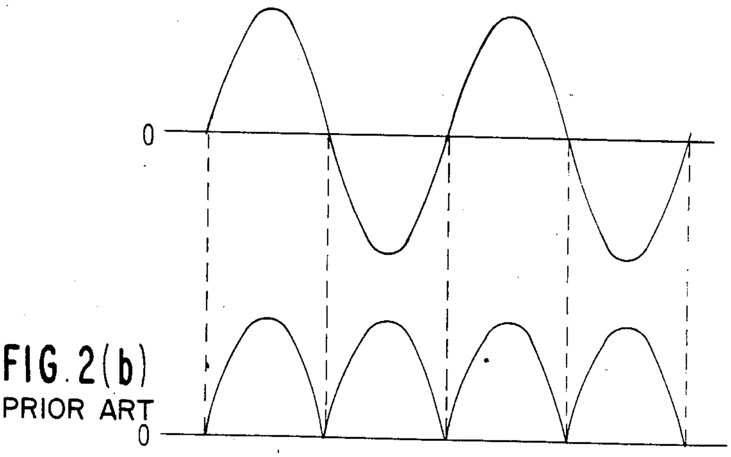
FIG. 2(b)
PRIOR ART
FIG. 3
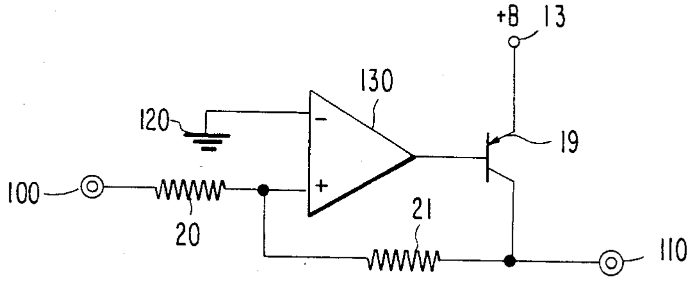

FIG. 4
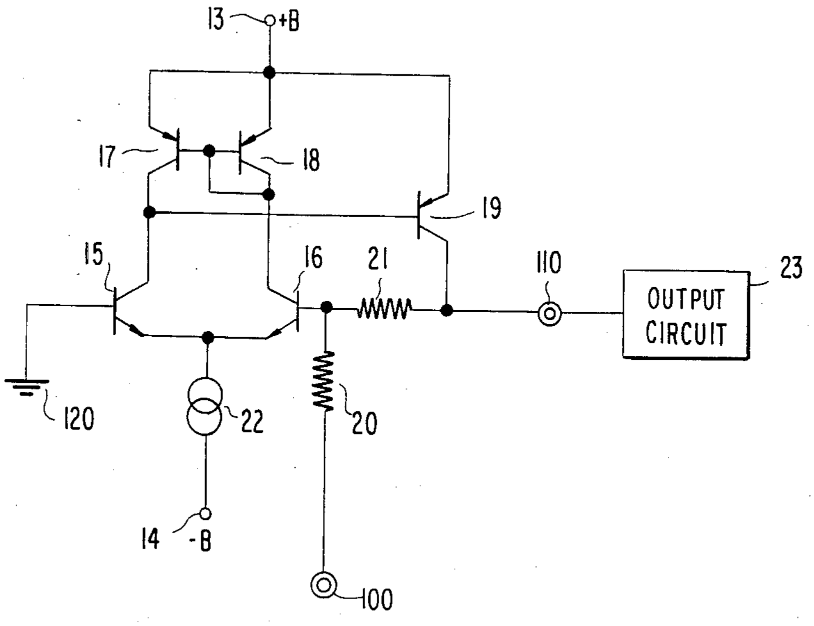
FIG. 5(a)
FIG. 5(b)
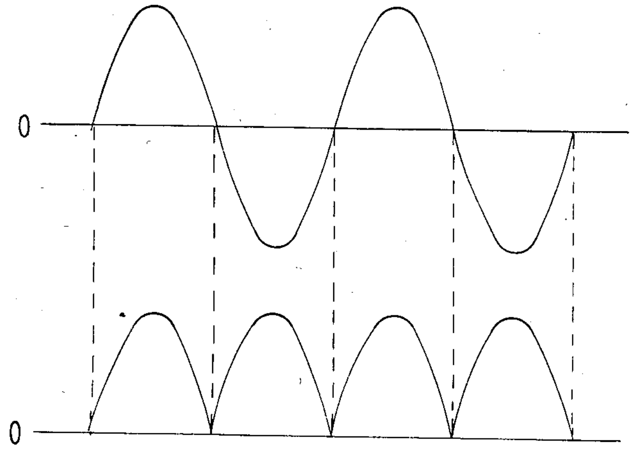
FIG. 6
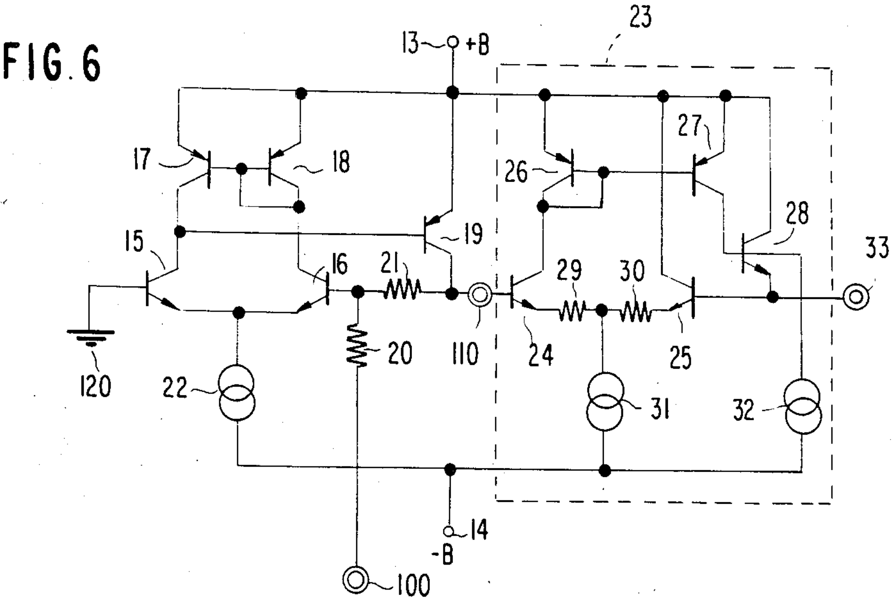

FULL-WAVE RECTIFIER USING AN OPERATIONAL AMPLIFIER

BACKGROUND OF THE INVENTION

The present invention relates to an improved full-wave rectifier circuit, and more particularly to a full-wave rectifier using an operational amplifier.

A prior art full-wave rectifier uses two operational amplifiers as shown in FIG. 1. More specifically, a resistor 3, a resistor 4 and the cathode of a diode 9 are connected to an inverting input of an operational amplifier 1 whose non-inverting input is connected to a reference potential point 12. The other end of the resistor 3 is connected to an input terminal 10 and to a resistor 5; and the other end of the resistor 4 is connected to the anode of a diode 8 and to a resistor 6. The cathode of the diode 8 is connected to the output of the operational amplifier 1 and to the anode of diode 9; and the other end of the resistor 6 is connected to an inverting input of an operational amplifier 2 and to a resistor 7. The noninverting input of the operational amplifier 2 is connected to a reference potential 12'. The other end of the resistor 7 is connected to the output of the operational amplifier 2 and to an output terminal 11.

The operation of the rectifier in the prior art will now be explained. When a positive input voltage $V_{INA}$ is applied to the input terminal 10, the diode 8 is rendered conductive and the diode 9 is rendered non-conductive. The operational amplifier 1 operates as a feed-back amplifier having an amplification factor defined by resistors 3 and 4. If the resistances of the resistors 3 and 4 are denoted by $R_3$ and $R_4$, the output voltage $V_{OUTD}$ at the point D is given by the following equation (1), $$V_{OUTD} = -\frac{R_4}{R_3} \times V_{INA} \tag{1}$$

Here, the electric currents flowing through the resistors 5, 6 and 7 are denoted by $I_5$, $I_6$ and $I_7$. If the operational amplifiers 1 and 2 have infinitely great input impedances and, since the potentials at the inputs B and E of the operational amplifiers 1 and 2 can be assumed to be the same as the reference potential, the electric currents $I_5$ and $I_6$ are given by the following equations (2) and (3), $$I_5 = \frac{V_{INA}}{R_5} \tag{2}$$

$$I_6 = \frac{V_{OUTD}}{R_6} \tag{3}$$

where R5 and R6 denote resistances of the resistors 5 and 6.

Furthermore, the following equation (4) holds true among the electric currents $I_5$, $I_6$ and $I_7$, $$I_7 = I_5 + I_6 \tag{4}$$

If the equations (2) and (3) are substituted for the equation (4), the current $I_7$ is given by the equation (5), $$I_7 = \frac{V_{INA}}{R_5} + \frac{V_{OUTD}}{R_6} \tag{5}$$

If the equation (1) is substituted for the equation (5), the current $I_7$ is given by the equation (6), $$I_7 = \frac{V_{INA}}{R_5} + \frac{1}{R_6} \times \left(-\frac{R_4}{R_3} \times V_{INA}\right) = \left(\frac{1}{R_5} - \frac{R_4}{R_3 \times R_6}\right) \times V_{INA} \tag{6}$$

Here, if the output voltage at the output point F of the operational amplifier 2 is denoted by $V_{OUTF1}$ and the resistance of the resistor 7 by $R_7$, the voltage $V_{OUTF1}$ at the output point F is expressed by the equation (7), $$V_{OUTF1} = -R_7 \times I_7 \tag{7}$$

Hence, if the equation (6) is substituted for the equation (7), there holds the following equation (8), $$V_{OUTFI} = -R_7 \times \left(\frac{1}{R_5} - \frac{R_4}{R_3 \times R_6}\right) \times V_{INA} = R_7 \times \left(\frac{R_4}{R_3 \times R_6} - \frac{1}{R_5}\right) \times V_{INA} \tag{8}$$

If the following equations (9) and (10) hold, the equation (8) can be replaced by the equation (11), $$R_3 = R_4 = R_6 = R \tag{9}$$

$$R_5 = R_7 = 2R \tag{10}$$

$$V_{OUTF1} = R_7 \times \left(\frac{R_4}{R_3 \times R_6} - \frac{1}{R_5}\right) \times V_{INA} = 2R \times \left(\frac{R}{R \times R} - \frac{1}{2R}\right) \times V_{INA} = 2R \times \frac{1}{2R} \times V_{INA} = V_{INA} \tag{11}$$

Therefore, when a positive input voltage $V_{INA}$ is applied to the input terminal 10, the same positive input voltage $V_{INA}$ appears on the output point F of the operational amplifier 2, i.e., appears on the output terminal 11, provided the above-mentioned resistances are set according to equations (9) and (10).

Next, when a negative input voltage $V'_{INA} = -V_{INA}$ is applied to the terminal 10, the diode 8 is rendered non-conductive, and the diode 9 is rendered conductive. Consequently, the potential becomes zero at the point D, resulting in no voltage drop across the resistor 6, i.e., both terminals of the resistor 6 are held at the reference potential, and no current flows through the resistor 6.

From the equations (4) and (5), therefore, the equation (12) holds true.

$$I_7 = I_5 + I_6 = I_5 \ (\because I_6 = 0) \tag{12}$$

-continued $$= -\frac{V_{INA}}{R_5}$$

Therefore, the output voltage $V_{OUTF2}$ at the output point F of the operational amplifier 2 is given by the equation (13), $$V_{OUTF2} = -R_7 \times I_7 \quad (13)$$

$$= -R_7 \times \left(-\frac{V_{INA}}{R_5}\right)$$

$$= \frac{R_7}{R_5} \times V_{INA}$$

Here, if the equation (10) holds, the equation (13) is rewritten as, $$V_{OUTF2} = \frac{2R}{2R} \times V_{INA} \quad (14)$$

$$= V_{INA}$$

Therefore, when the negative input voltage $V'_{INA}$ ($-V_{INA}$) is applied to the input terminal 10, a voltage of the same voltage level but having an inverted sign, i.e., the voltage $V_{INA}$, is obtained from the output point F of the operational amplifier or from the output terminal 11.

Thus, the circuit of FIG. 1 operates as an absolute-value circuit which always produces output voltages of positive polarity upon receipt of input voltages of both positive and negative polarities. That is, when signals of sinusoidal waveform such as shown in FIG. 2(*a*) are input to the input terminal 10, the output terminal 11 produces signals in which the positive portions of the input sinusoidal waves are output in their original form while the negative portions are output after they are inverted to positive portions as shown in FIG. 2(*b*). In other words, the circuit in the prior art operates as a full-wave rectifier. The conventional rectifier circuit shown in FIG. 1, however, requires five resistors having accurate resistances, two diodes and two operational amplifiers, i.e., two amplifier circuits, and further must satisfy the requirements of equations (9) and (10) for the five resistors. To realize a rectifying circuit, therefore, a considerable number of elements must be used, and it is necessary to maintain very high accuracy in the resistance values of the five resistors.

SUMMARY OF THE INVENTION

The primary object of the present invention is to provide a rectifier which can be realized with greatly reduced number of elements compared with the conventional rectifiers, and which does not require highly accurate resistance values of resistors used therein.

The rectifier of the present invention includes an amplifier having an inverting input, a non-inverting input and an output, the inverting input being held at a reference potential, an input terminal receiving an input signal to be rectified, a first resistor inserted between the input terminal and the non-inverting input of the amplifier, a transistor having a base electrically connected to the output of the amplifier, said transistor also having a collector and an emitter, a second resistor having one end electrically connected to the non-inverting input of the amplifier and the other end electrically connected to the collector of the transistor, and an output terminal electrically connected to the other end of the second resistor.

According to the present invention, during a period when the input signal is positive with respect to the reference potential, the input signal is provided unchanged at the output terminal. When the input signal is lower than the reference potential, the transistor is energized to produce an output having a different polarity from the input and having a voltage defined by the resistance ratio of the first and second resistors. Therefore, a full-wave rectified output is obtained at the output terminal by setting the resistances of the first and second resistors to be equal.

The requirement for achieving this full-wave rectification is only four circuit elements, i.e., one amplifier, two resistors and one transistor, and equality of resistances of the first and second resistors. Thus, according to the present invention, a full-wave rectifier is obtained by a limited number of circuit elements and a fewer number of resistances to be matched.

BRIEF DESCRIPTION OF THE DRAWINGS

FIG. 1 is a circuit diagram of a prior art full-wave rectifier;

FIGS. 2(*a*) and 2(*b*) are diagrams of signal waveforms which illustrate input and output characteristics of the rectifier shown in FIG. 1;

FIG. 3 is a block diagram showing a concept of the full-wave rectifier according to the present invention;

FIG. 4 is a circuit diagram which illustrates a first embodiment of the present invention;

FIGS. 5(*a*) and 5(*b*) are diagrams of signal waveforms which illustrate input and output characteristics of the rectifier shown in FIG. 3; and FIG. 6 is a circuit diagram of the full-wave rectifier which illustrates a second embodiment having a high input impedance output circuit.

DETAILED DESCRIPTION OF THE INVENTION

Referring now to FIG. 3, the fundamental construction of the present invention consists of one amplifier 130, one transistor 19 and two resistors 20 and 21. An input signal to be full-wave rectified with respect to the reference potential is received at the input terminal 100 and applied to the non-inverting input (+) of the amplifier 130 through the first resistor 20. A reference potential is applied to the inverting input (−) of the amplifier 130 from the reference potential point 120. Preferably, an operational amplifier is employed as the amplifier 130. The output from the amplifier 130 is applied to the base of the transistor 19 whose emitter is connected to the power supply terminal 13 held at a voltage +B. The non-inverting terminal (+) of the amplifier 130 and the collector of the transistor 19 are connected by the second resistor 21. The junction between the collector of the transistor 19 and the resistor 21 is connected to the output terminal 110.

The operation of the present invention shown in FIG. 3 will now be briefly explained. When the input signal applied to the input terminal 100 is positive with respect to the reference potential at the point 120, the transistor is held in a non-conduction state, and the output signal obtained at the output terminal 110 is therefore the same as the input signal. On the contrary, when the input signal is negative with respect to the reference potential, the transistor 19 is driven to be made conductive by a negative polarity output from the amplifier 130. The output signal at the collector of the transistor 19 has a polarity opposite to that of the input signal and is fed back to the non-inverting terminal of the amplifier 130 through the resistor 21. Therefore transistor 19 inverts the negative polarity input. Since the resistance of the resistors 20 and 21 are preferably selected to have the same value, the amplitude of the output signal at the collector of the transistor 19 is the same as that of the input signal, but the polarity is opposite that of the input signal. Thus, a full-wave rectifier operation is obtained.

This type of the full-wave rectifier may be advantageously used in a signal detector or an automatic gain or level control circuit. For example, in the signal detector, the present invention may be used to rectify the modulated carrier signal. In an automatic gain or level control circuit, it is necesary to obtain a D.C. signal having an amplitude corresponding to the input signal level. The present invention is preferably used to convert the input signal level into the corresponding D.C. signal.

The conceptional circuit shown in FIG. 3 can be realized by a circuit design as shown in FIG. 4 which is a first embodiment of the present invention. Two NPN transistors 15 and 16 constitute a differential amplifier in conjunction with PNP transistors 17 and 18. This differential amplifier may be a single operational amplifier. Emitters of the transistors 15 and 16 are commonly connected through a constant-current source 22 to a negative power supply terminal 14 held at a negative voltage −B. Emitters of the transistors 17 and 18 are commonly connected to a positive power supply terminal 13 held at a positive voltage +B. The transistors 17 and 18 are connected to form a current mirror circuit by connecting the bases of both transistors 17 and 18 to each other and to the collector of the transistor 18 and connecting them as a load to transistors 15 and 16. The connection point of the collectors of the transistors 15 and 17 is connected to the base of PNP transistor 19 having its emitter connected to the positive power supply terminal 13 and collector connected in both a 10KΩ resistor 21 and an output terminal 110. The base of the transistor 16 is connected to the other end of the resistor 21, and receives an input signal applied at an input terminal 100 through a resistor 20 having a resistance of 10KΩ which is the same as the resistance of the resistor 21. The base of the transistor 15 is held at a reference potential, for example, a ground potential, by connecting it to the reference point 120.

The reference numeral 23 denotes a high input impedance output circuit. This high input impedance output circuit 23 is not necessary if a load to be directly connected to the output terminal 110 has an input impedance sufficiently higher than the output impedance of the full-wave rectifier at the output terminal 110. If not, the amplitude of the output signal corresponding to positive halves of the input signal decreases, it is therefore preferable to employ the high input impedance output circuit 23 at the output terminal 110. The input impedance of the output circuit 23 should be equal to or greater than the resistance of the resistor 20 and 21, and is more preferably selected to be equal to or greater than 100KΩ.

The high input impedance output circuit 23 may be replaced with a load resistor having a resistance equal to the input impedance selected as above. The load resistor is preferably inserted between the output terminal 110 and the positive power supply terminal 13.

Next, the operation of the full-wave rectifier shown in FIG. 4 will be fully explained. When a positive portion of an input voltage $V_{IN1}$ is applied to the input terminal 100, the transistor 16 is rendered conductive and the transistor 15 is rendered nonconductive since its base has been connected to the reference potential point. Therefore, the transistor 19 is rendered non-conductive. Consequently, the voltage $V_{IN1}$ of the positive portion of the input signal appears unchanged at the output terminal 110 via resistors 20 and 21.

Here, resistances of the resistors 20 and 21 are denoted by $R_{20}$, $R_{21}$. In general, the input impedance ($Z_{in16}$) of the transistor 16 as viewed from the resistor 20 is sufficiently great compared with the resistances $R_{20}$, $R_{21}$. Further, the output terminal 110 is connected to the output circuit 23 having a high input impedance (the input impedance is denoted by $Z_{in23}$). Therefore, the following relations (15) and (16) hold, $$Z_{in16} >> R_{20}, R_{21} \quad (15)$$

$$Z_{in23} >> R_{20}, R_{21} \quad (16)$$

Under these conditions, the output voltage $V_{OUT1}$ produced at the output terminal 110 is given by the following equation (17), $$V_{OUT1} = \frac{Z_{in23}}{R_{20} + R_{21} + Z_{in23}} \times V_{IN1} \cong \frac{Z_{in23}}{Z_{in23}} \times V_{IN1} = V_{IN1} \quad (17)$$

Thus, the output terminal 110 produces a voltage which is substantially equal to the positive half input voltage $V_{IN1}$ applied to the input terminal 100.

Then, when a negative portion of the input signal having a voltage $-V_{IN1}$ is applied to the input terminal 100, the transistor 16 is rendered non-conductive since its base potential becomes lower then the base potential of the transistor 15. The transistor 15, on the other hand, is rendered conductive, and the transistor 19 is also rendered conductive. Accordingly, the circuit shown in FIG. 4 operates as an inverting amplifier for negative inputs applied to the input terminal 100. That is, the non-inverted output obtained from the collector of the differential amplifier transistor 15 is inverted by the transistor 19 to be derived at the output terminal 110. The gain at this moment is determined by the resistance ratio of the resistors 20 and 21. That is, the output voltage $V_{OUT2}$ obtained at the output terminal 110 at this moment is given by the equation (18), $$V_{OUT2} = -\frac{R_{21}}{R_{20}} \times (-V_{IN1}) = \frac{R_{21}}{R_{20}} \times V_{IN1} \quad (18)$$

If the resistances $R_{20}$, $R_{21}$ of the resistors 20, 21 are made equal as represented by equation (19), equation (18) can be rewritten as the following equation (20), $$R_{20} \cong R_{21} \quad (19)$$

$$V_{OUT2} \cong V_{IN1} \quad (20)$$

That is, the polarity of the negative input signal is inverted to obtain a positive voltage $V_{IN1}$ at the output terminal 110.

Thus, the circuit of FIG. 4 always produces output voltages of positive polarity at the output terminal 110 regardless of the polarity of the input signal. Therefore, when an input signal having a sinusoidal wave as shown in FIG. 5(*a*) is applied to the input terminal 100, the output terminal 110 produces an output signal in which the negative portions of the input signal are inverted into positive portions as shown in FIG. 5(*b*). In other words, the circuit works as a full-wave rectifier.

Now referring to FIG. 6, a second embodiment of the present invention will be explained. The second embodiment has a high input impedance output circuit 23 in addition to the full-wave rectifier shown in FIG. 4. The high input impedance output circuit 23 is realized by a differential buffer type circuit. The emitters of NPN transistors 24 and 25 are connected together via resistors 29 and 30. The connection point of the resistors 29 and 30 is further connected to the negative power supply terminal 14 via a constant-current source 31. The base of the transistor 24 is connected to the output terminal 110, and the base of the transistor 25 is connected to emitter of an NPN transistor 28 and to another output terminal 33. The collector of the transistor 24 is connected to a point where base and collector of a diode-connected PNP transistor 26 are connected together, and is also connected to the base of a PNP transistor 27. The emitters of the transistors 26, 27, the collector of the transistor 25 and the collector of the transistor 28 are commonly connected to the positive power supply terminal 13. Further, the collector of the transistor 27 is connected to the base of the transistor 28 and to a constant current source 32 which is, in turn, connected to the negative power supply terminal 14.

The second embodiment shown in FIG. 6 includes an output circuit 23 of a differential buffer type which exhibits an extremely high input impedance. For example, if the resistances of the resistors 29 and 30 are selected respectively as 3KΩ, the amplification factors (hFE) of the transistors 24 and 25 are approximately 400, and the emitter current flowing through the transistor 24 is approximately 0.1 mA, then an input impedance $Z_{in23}$ of 1.3MΩ is obtained. Such a high input impedance $Z_{in23}$ is very high as compared to the resistances of the resistors 20 and 21. Therefore, the full-wave rectification operation as explained in connection to the first embodiment is ensured. Any circuit having a low input impedance can be applied to the output terminal 33 without impairing the full-wave rectification operation.

According to the present invention as mentioned above, a full-wave rectifier is realized by a small number of elements, i.e. by an operational amplifier such as a differential amplifier and a transistor. Thus, the full-wave rectifier of the present invention is very simple in circuit construction. Furthermore, it is only necessary to equalize two resistance values, in contrast to the conventional circuit which requires five resistance elements to be adjusted. This is most advantageous when the full-wave rectifier is formed in a semiconductor integrated circuit in which it is difficult to obtain resistors having accurate resistance values. With regard to adjusting the offset, furthermore, the circuit of the present invention requires only a single operational amplifier and is therefore advantageous over the conventional circuit which employs two operational amplifiers.

What is claimed is:

1. A full-wave rectifier, comprising:
- an input terminal;
- a reference terminal held at a reference voltage;
- a voltage terminal held at a voltage which is higher in absolute value than said reference voltage;
- an amplifier having an inverting input connected to said reference terminal, a non-inverting input and an output;
- a first resistor inserted between said input terminal and said non-inverting input of said amplifier;
- a transistor having a base coupled to said output of said amplifier, and also having an emitter coupled to said voltage terminal and a collector;
- a second resistor having one end coupled to said non-inverting input of said amplifier and the other end coupled to said collector of said transistor; and
- an output terminal coupled to said other end of said second resistor.

2. A full-wave rectifier as claimed in claim 1, wherein resistance values of said first and second resistors are substantially equal.

3. A full-wave rectifier as claimed in claim 2, wherein said amplifier is an operational amplifier.

4. A full-wave rectifier as claimed in claim 2, further comprising an output circuit having an input end connected to said output terminal and an output end, said output circuit having an input impedance equal to or greater than said resistance values of said first and second resistors.

5. A full-wave rectifier as claimed in claim 4, wherein said input impedance is equal to or greater than 100KΩ.

6. A full-wave rectifier as claimed in claim 4, wherein said output circuit comprises a differential type buffer circuit.

7. A full-wave rectifier as claimed in claim 2, further comprising a load resistor coupled to said output terminal, said load resistor having a resistance value equal to or greater than said resistance values of said first and second resistors.

8. A full-wave rectifier as claimed in claim 7, wherein said load resistor has a resistance value equal to or greater than 100KΩ.

9. A rectifier comprising first and second transistors and having a base and connected to form a differential amplifier, said first and second transistors being of a first conductivity type, a first means for applying a reference potential to the base of said first transistor, a third transistor of a second conductivity type different from said first conductivity type, said third transistor having a base receiving a signal from the collector of said first transistor, an emitter biased at a constant voltage which is positive with respect to said reference potential and a collector, a first resistor having one end connected to the base of said second transistor and having another end, a second means for applying an input signal to said other end of said first resistor, a second resistor inserted between said base of said second transistor and said collector of said third transistor, and a third means for producing an output signal from the connection point of said second resistor and said collector of said third transistor.

10. A rectifier as claimed in claim 9, wherein resistance values of said first and second resistors are substantially equal.

11. A rectifier as claimed in claim 10, further comprising a fourth transistor having a collector connected to the collector of said first transistor, and also having a base and an emitter, and a fifth transistor having a base and collector which are connected to both the collector of said second transistor and the base of said fourth transistor and having an emitter connected to the emitter of said fourth transistor, said fourth and fifth transistors having said second conductivity type.

12. A rectifier as claimed in claim 10, further comprising an output circuit having an input end connected to said third means, said output circuit having an input impedance equal to or greater than said resistance values of said first and second resistors.

13. A rectifier as claimed in claim 12, wherein said input impedance of said output circuit is equal to or greater than 100KΩ.

14. A rectifier as claimed in claim 10, further comprising a load resistor coupled to said third means, said load resistor having a resistance value equal to or greater than said resistance values of said first and second resistors.

15. A rectifier as claimed in claim 14, wherein said resistance value of said load resistor is equal to or greater than 100KΩ.

16. A full-wave rectifier circuit for receiving and rectifying an input signal, said circuit comprising:

a first potential source;

a second potential source;

an operational amplifier having first and second input terminals and an output terminal, said second input terminal being coupled to said first potential source;

a first resistor having a first end for receiving said input signal and a second end coupled to said first input terminal of said operational amplifier;

a second resistor having a first end connected to said first input terminal and having a second end; and a transistor having an emitter, base and collector, said base being coupled to said operational amplifier output, one of said emitter and collector being coupled to said second potential source and the other of said emitter and collector being coupled to said second end of said second resistor, the junction point of said collector and second resistor providing a rectified output signal.

* * * * *

UNITED STATES PATENT AND TRADEMARK OFFICE
CERTIFICATE OF CORRECTION

PATENT NO. : 4,564,814

DATED : January 14, 1986

INVENTOR(S) : Masami MIURA and Takeshi KUWAJIMA

It is certified that error appears in the above-identified patent and that said Letters Patent is hereby corrected as shown below:

Column 5, Line 27, "single" should read --simple--

Column 8, Line 48, "and having a base" should read --each having a base--;

Signed and Sealed this

Fourteenth Day of April, 1987

*Attest:*

DONALD J. QUIGG

*Attesting Officer* *Commissioner of Patents and Trademarks*